United States Patent
Lin et al.

(10) Patent No.: US 7,681,164 B2
(45) Date of Patent: Mar. 16, 2010

(54) METHOD AND APPARATUS FOR PLACING AN INTEGRATED CIRCUIT DEVICE WITHIN AN INTEGRATED CIRCUIT LAYOUT

(75) Inventors: Xi-Wei Lin, Fremont, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 278 days.

(21) Appl. No.: 11/848,524

(22) Filed: Aug. 31, 2007

(65) Prior Publication Data

US 2009/0064072 A1    Mar. 5, 2009

(51) Int. Cl.
*G06F 17/50* (2006.01)
(52) U.S. Cl. .......................................................... 716/8
(58) Field of Classification Search ....................... 716/8
See application file for complete search history.

(56) References Cited

U.S. PATENT DOCUMENTS

| | | | | |
|---|---|---|---|---|
| 4,700,316 A | * | 10/1987 | Nair | 716/17 |
| 5,677,867 A | * | 10/1997 | Hazani | 365/185.01 |
| 6,953,970 B2 | * | 10/2005 | Yuan et al. | 257/350 |
| 7,335,583 B2 | * | 2/2008 | Chang | 438/618 |

* cited by examiner

*Primary Examiner*—Vuthe Siek
*Assistant Examiner*—Brandon W Bowers
(74) *Attorney, Agent, or Firm*—Park, Vaughan & Fleming LLP

(57) ABSTRACT

A system that places an integrated circuit (IC) device within an IC chip layout is presented. During operation, the system receives the IC device to be placed within the IC chip layout, wherein the IC chip layout includes one or more continuous rows of diffusion. Next, the system places the IC device within a continuous row of diffusion. The system then determines whether the IC device is to be electrically isolated from other IC devices. If so, the system inserts one or more isolation devices within the continuous row of diffusion so that the IC device can be electrically isolated from other IC devices. The system then biases the one or more isolation device so that the IC device is electrically isolated from other IC devices within the continuous row of diffusion.

17 Claims, 7 Drawing Sheets

METHOD AND APPARATUS FOR PLACING AN INTEGRATED CIRCUIT DEVICE WITHIN AN INTEGRATED CIRCUIT LAYOUT

BACKGROUND

1. Field of the Invention

The present invention relates to techniques for designing integrated circuits. More specifically, the present invention relates to a method and apparatus for placing an integrated circuit device within an integrated circuit layout.

2. Related Art

Systematic variations in transistor performance can arise during the process of fabricating an integrated circuit (IC) chip. These systematic variations become increasingly dominant in nanometer-scale semiconductor technologies. For example, variations in polysilicon pitch can lead to variations in the critical dimension of transistor gates and threshold voltages due to the optical effects in lithography and uneven amount of lateral polysilicon etching, which can have a significant impact on circuit performance. Similarly, variations in the placement of active diffusion regions can affect carrier mobility and threshold voltage as a result of changes in mechanical stress and transient enhanced impurity diffusion.

One technique for minimizing systematic variations is to impose regularity within an IC layout. For example, a fixed polysilicon pitch can be used to enforce regularity. This is achieved by requiring polysilicon lines to be placed on a fixed grid so that a polysilicon gate is placed in every grid location regardless of whether an IC device is to be created at the grid location. For example, FIG. 4 illustrates a typical standard cell IC layout wherein polysilicon lines are placed on a fixed grid. FIG. 4 includes active diffusion regions 400-405, polysilicon lines 406-414, and metal lines 415-416. Note that active diffusion regions 400-402 and active diffusion regions 403-405 can be different types of active diffusion regions. For example, active diffusion regions 400-402 can be p-type active diffusion regions and active diffusion regions 403-405 can be n-type active diffusion regions.

When a polysilicon line overlaps an active region, a transistor is formed. For example, in FIG. 4, transistors are formed when polysilicon lines 406-408 overlap active diffusion regions 400 and 403; polysilicon line 409 overlap active diffusion regions 401 and 404; and polysilicon lines 410-411 overlap active diffusion regions 402 and 405. However, note that polysilicon lines 412-414, which are referred to as "dummy polysilicon lines," do not overlap any active diffusion regions and hence do not form any transistors. These dummy polysilicon lines 412-414 are used to maintain regularity in the IC layout.

As illustrated in FIG. 4, existing techniques use shallow trench isolation (STI) to separate one device from another (i.e., active IC devices separated by regions without active diffusion). However, when logic cells are placed in rows, there can be a lack of regularity across active diffusion regions. This is because each diffusion edge presents a discontinuity that can cause device property variations such as: threshold voltage changes due to transient enhanced diffusion; mobility changes due to mechanical stress; capacitance changes due to diffusion area variation; and resistance changes due to contact misalignment to source/drain diffusion areas.

Hence, what is needed is a method and an apparatus for placing IC devices within an IC layout without the problems described above.

SUMMARY

One embodiment of the present invention provides a system that places an integrated circuit (IC) device within an IC chip layout. During operation, the system receives the IC device to be placed within the IC chip layout, wherein the IC chip layout includes one or more continuous rows of diffusion. Next, the system places the IC device within a continuous row of diffusion. The system then determines whether the IC device is to be electrically isolated from other IC devices. If so, the system inserts one or more isolation devices within the continuous row of diffusion so that the IC device can be electrically isolated from other IC devices. The system then biases the one or more isolation device so that the IC device is electrically isolated from other IC devices within the continuous row of diffusion.

In some embodiments, the IC device includes a transistor which is formed by overlapping the continuous row of diffusion with a gate structure.

In some embodiments, an isolation device includes a transistor which is formed by overlapping the continuous row of diffusion with a gate structure.

In some embodiments, while biasing the isolation device, the system couples the gate structure to a bias voltage so that the isolation device does not substantially conduct current.

In some embodiments, while biasing the isolation device, the system couples the gate structure to a bias voltage which is higher than a power supply voltage for the IC chip, so that the isolation device does not substantially conduct current.

In some embodiments, while biasing the isolation device, the system couples the gate structure to a bias voltage which is lower than a ground voltage for the IC chip so that the isolation device does not substantially conduct current.

In some embodiments, within a given continuous row of diffusion, gate structures for IC devices are substantially equally spaced.

In some embodiments, a given continuous row of diffusion substantially spans the entire IC chip layout.

In some embodiments, one or more isolation devices are placed at the ends of the given continuous row of diffusion.

In some embodiments, a given continuous row of diffusion has a predetermined width which is constant across the given continuous row of diffusion.

In some embodiments, prior to placing the IC device, the system generates the one or more continuous rows of diffusion within the IC chip layout.

In some embodiments, the continuous row of diffusion can include: a n-type diffusion; and a p-type diffusion.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

Systematic variations in feature geometries can be substantially minimized if discontinuities between active diffusion regions can be reduced. To achieve this reduction, some embodiments of the present invention create continuous, unsegmented rows of active diffusion regions and use transistor gates biased to specified voltages to create electrical isolation. In these embodiments, STI is only used to isolate NMOS transistors from PMOS transistors (but is not used to isolate NMOS transistors from NMOS transistors or PMOS transistors from PMOS transistors) and thus, the diffusion edges between adjacent IC devices are eliminated. Note that some embodiments of the present invention do not change the logic design flow. Furthermore, the techniques described below can be performed automatically during a place-and-route process for standard cell IC designs, or manually during a layout process for custom IC designs.

Also note that although the discussion below refers to transistor gates made from polysilicon, any suitable material now known or later developed can be used for the transistor gates.

Computer System

Figure 1:
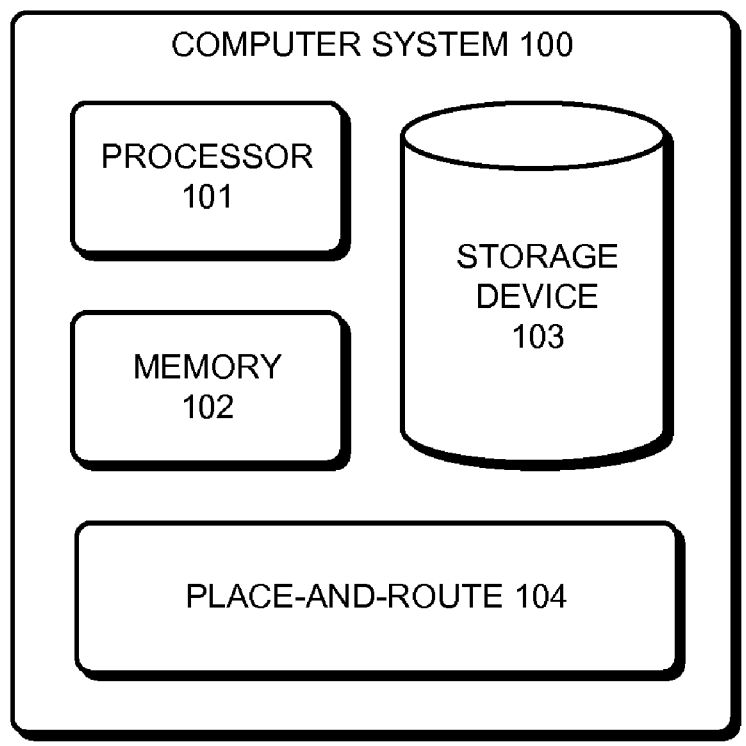
FIG. 1 presents a block diagram of a computer system

FIG. 1 illustrates a computer system 100. Computer system 100 includes processor 101, memory 102, and storage device 103.

Processor 101 can generally include any type of processor, including, but not limited to, a microprocessor, a mainframe computer, a digital signal processor, a personal organizer, a device controller, a computational engine within an appliance, and any other processor now known or later developed. Furthermore, processor 101 can include one or more cores.

Note that although FIG. 1 illustrates computer system 100 with one processor, computer system 100 can include more than one processor. In a multi-processor configuration, the processors can be located on a single system board, or multiple system boards.

Memory 102 can include any type of memory, including but not limited to, dynamic random access memory (DRAM), static random access memory (SRAM), flash memory, read only memory (ROM), and any other type of memory now known or later developed.

Storage device 103 can include any type of storage device that can be coupled to a computer system. This includes, but is not limited to, magnetic, optical, magneto-optical storage devices, storage devices based on flash memory and/or battery-backed up memory, and any other storage device now known or later developed.

Figure 2:
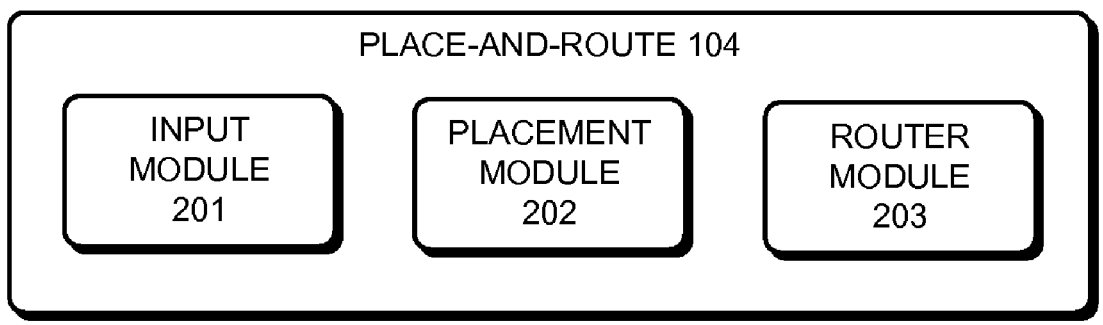
FIG. 2 presents a block diagram of a place-and-route module in accordance with an embodiment of the present invention.

FIG. 2 presents a block diagram of place-and-route module 200 in accordance with an embodiment of the present invention. Place-and-route module 200 includes input module 201; placement module 202; and router module 203. Input module 201 is configured to receive an IC device to be placed within an IC chip layout, wherein the IC chip layout includes one or more continuous rows of diffusion. Placement module 202 is configured to: place the IC device within a continuous row of diffusion; and determine whether the IC device is to be electrically isolated from other IC devices. If the IC device is to be electrically isolated from other IC devices, placement module 202 is configured to insert one or more isolation devices within the continuous row of diffusion so that the IC device can be electrically isolated from other IC devices. Furthermore, router module 203 is configured to bias the one or more isolation device so that the IC device is electrically isolated from other IC devices within the continuous row of diffusion.

Flow Summary and Context

Figure 3:
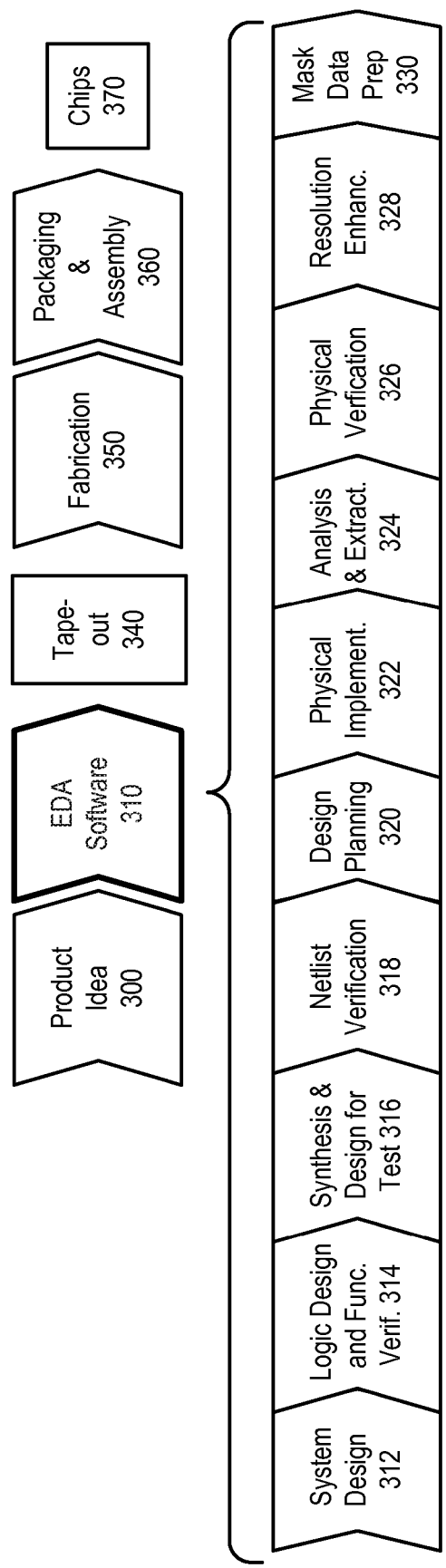
FIG. 3 presents a simplified representation of an exemplary digital ASIC design flow.

Before proceeding further with the description, it may be helpful to place this process in context. FIG. 3 presents a simplified representation of an exemplary digital ASIC design flow. At a high level, the process starts with the product idea (step 300) and is realized in an EDA software design process (step 310). When the design is finalized, it can be taped-out (event 340). After tape out, the fabrication process (step 350) and packaging and assembly processes (step 360) occur resulting, ultimately, in finished chips (result 370).

The EDA software design process (step 310) is actually composed of a number of steps 312-330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 310) will now be provided.

System design (step 312): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products. Note that Saber is a registered trademark of SabreMark Limited Partnership.

Logic design and functional verification (step 314): At this stage, the VHDL, Verilog, or SystemVerilog code for modules in the system is written and the design is checked for functional accuracy. More specifically, does the design as checked to ensure that produces the correct outputs. Exemplary EDA software products from Synopsys, Inc. that can be used at this step include VCS®, VERA®, DesignWare®, Magellan™, Formality®, ESP and LEDA® products.

Synthesis and design for test (step 316): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler, Physical Compiler®, Test Compiler, Power Compiler™, FPGA Compiler, Tetramax®, and DesignWare™ products.

Netlist verification (step 318): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 320): Here, an overall floorplan for the chip is constructed and analyzed for timing and top-level routing. Exemplary EDA software products from Synopsys, Inc. that can be used at this step include Astro™ and IC Compiler products.

Physical implementation (step 322): The placement (positioning of circuit elements) and routing (connection of the same) occurs at this step. Exemplary EDA software products from Synopsys, Inc. that can be used at this step include the Astro and IC Compiler products. Note that some embodiments of the present invention are directed to reducing variations caused from active diffusion irregularity.

Analysis and extraction (step 324): At this step, the circuit function is verified at a transistor level, this in turn permits what-if refinement. Exemplary EDA software products from Synopsys, Inc. that can be used at this step include Astro-Rail™, PrimeRail, PrimeTime®, and Star RCXT™ products.

Physical verification (step 326): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 328): This step involves geometric manipulations of the layout to improve manufacturability of the design. Exemplary EDA software products from Synopsys, Inc. that can be used at this step include Proteus, ProteusAF, and PSMGen products.

Mask data preparation (step 330): This step provides the "tape-out" data for production of masks for lithographic use to produce finished chips. Exemplary EDA software products from Synopsys, Inc. that can be used at this step include the CATS® family of products.

Note that VCS, VERA, DesignWare, Magellan, Formality, LEDA, Design Compiler, Physical Compiler, Power Compiler, Tetramax, DesignWare, Astro, Astro-Rail, PrimeTime, Star-RCXT, Hercules, and CATS are trademarks or registered trademarks of Synopsys, Inc. in the United States and other countries.

Continuous Diffusion Regions

Figure 4:
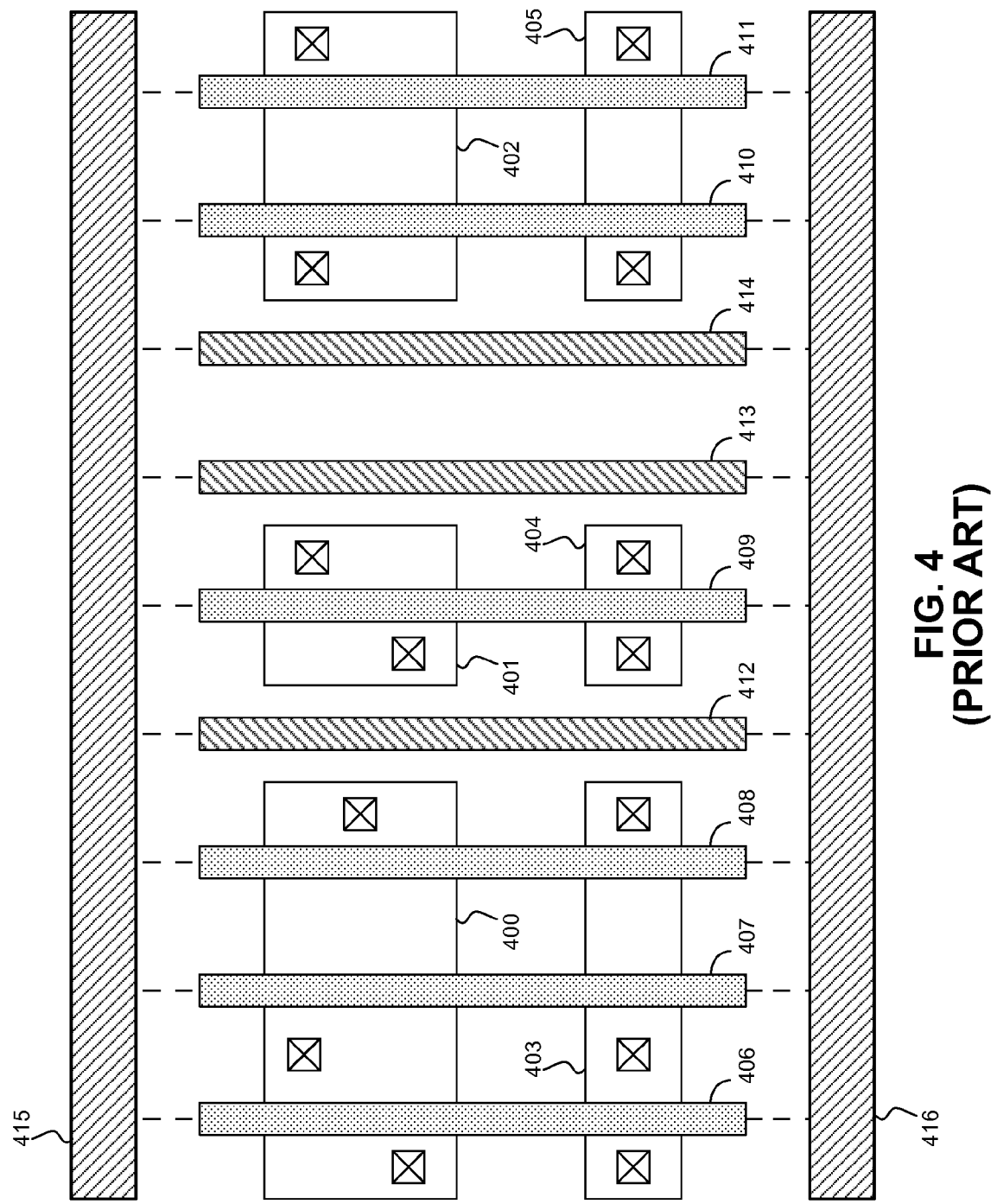
FIG. 4 illustrates a typical standard cell IC layout.
Figure 5:
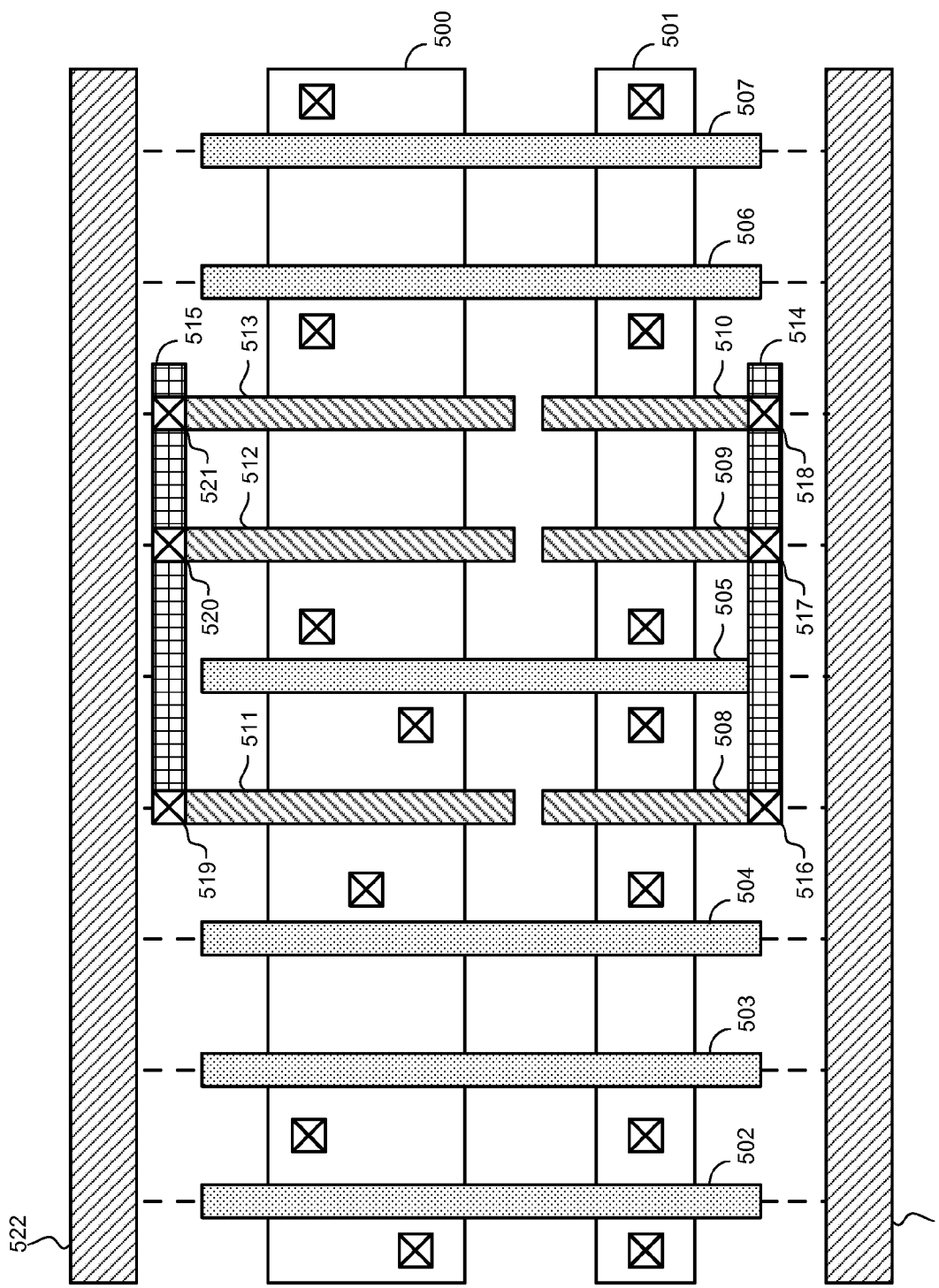
FIG. 5 illustrates a standard cell IC layout which includes continuous active diffusion regions in accordance with an embodiment of the present invention.

FIG. 5 illustrates a standard cell IC layout which includes continuous active diffusion regions 500-501 in accordance with an embodiment of the present invention. Note that FIG. 5 illustrates the same set of IC devices as are illustrated in FIG. 4 except that the active diffusion regions 400-402 have been combined into a single continuous active diffusion region 500. Similarly, active diffusion regions 403-405 have been combined into a single continuous active diffusion region 501. In some embodiments, a continuous row of diffusion substantially spans the entire IC chip layout. In these embodiments, isolation devices are placed at the ends of the given continuous row of diffusion to maintain regularity at the edges of the IC chip layout.

In some embodiments, active diffusion regions 500-501 can be different types of active diffusion regions. For example, active diffusion region 500 can be a p-type active diffusion region and active diffusion region 501 can be an n-type active diffusion region. In some embodiments, an active diffusion region has a predetermined width which is constant across the length of the active diffusion region.

In some embodiments, prior to placing IC devices within a continuous row of active diffusion, the system generates one or more continuous rows of active diffusion within the IC chip layout.

As illustrated in FIG. 5, polysilicon lines 502-507 and 511-513 overlap active diffusion region 500, and polysilicon lines 502-510 overlap active diffusion region 501. Note that dummy polysilicon lines 412-414 in FIG. 4 have been cut to form polysilicon lines 511-513 and 508-510. Since polysilicon lines 508-513 overlap an active region (thereby forming transistor gates), polysilicon lines 508-513 must be coupled to a voltage so that these transistor gates do not conduct current. For example, if active diffusion region 500 is a p-type active diffusion region, polysilicon lines 511-513 are coupled to VDD (or the highest voltage in the system). Similarly, if active diffusion region 501 is an n-type active diffusion region, polysilicon lines 508-510 are coupled to VSS (or the lowest voltage in the system). In doing so, the transistors formed by polysilicon lines 508-513 become isolation devices which can electrically isolate devices adjacent to the isolation devices. For example, the isolation devices formed by polysilicon lines 508-510 electrically isolate the transistors formed by polysilicon lines 502-504, polysilicon line 505, and polysilicon lines 506-507.

In some embodiments, contacts 516-518 couple polysilicon lines 508-510, respectively, to metal line 514. Hence, polysilicon lines 508-510 are coupled together. In some embodiments, contacts 519-521 couple polysilicon lines 511-513, respectively, to metal line 515. Hence, polysilicon lines 511-513 are coupled together. In some embodiments, metal lines 514-515 are coupled to voltages so that the transistors formed by polysilicon lines 508-513 do not substantially conduct. For example, if active diffusion region 500 is p-type active diffusion region, then metal line 515 can be coupled to VDD (or a voltage higher than VDD). If metal line 522 is a power bus (e.g., VDD), then metal line 515 can be coupled to metal line 522. Similarly, if active diffusion region 501 is n-type active diffusion region, then metal line 515 can be coupled to VSS (or a voltage lower than VSS). If metal line 523 is a ground bus (e.g., VSS), then metal line 514 can be coupled to metal line 523.

Figure 6:
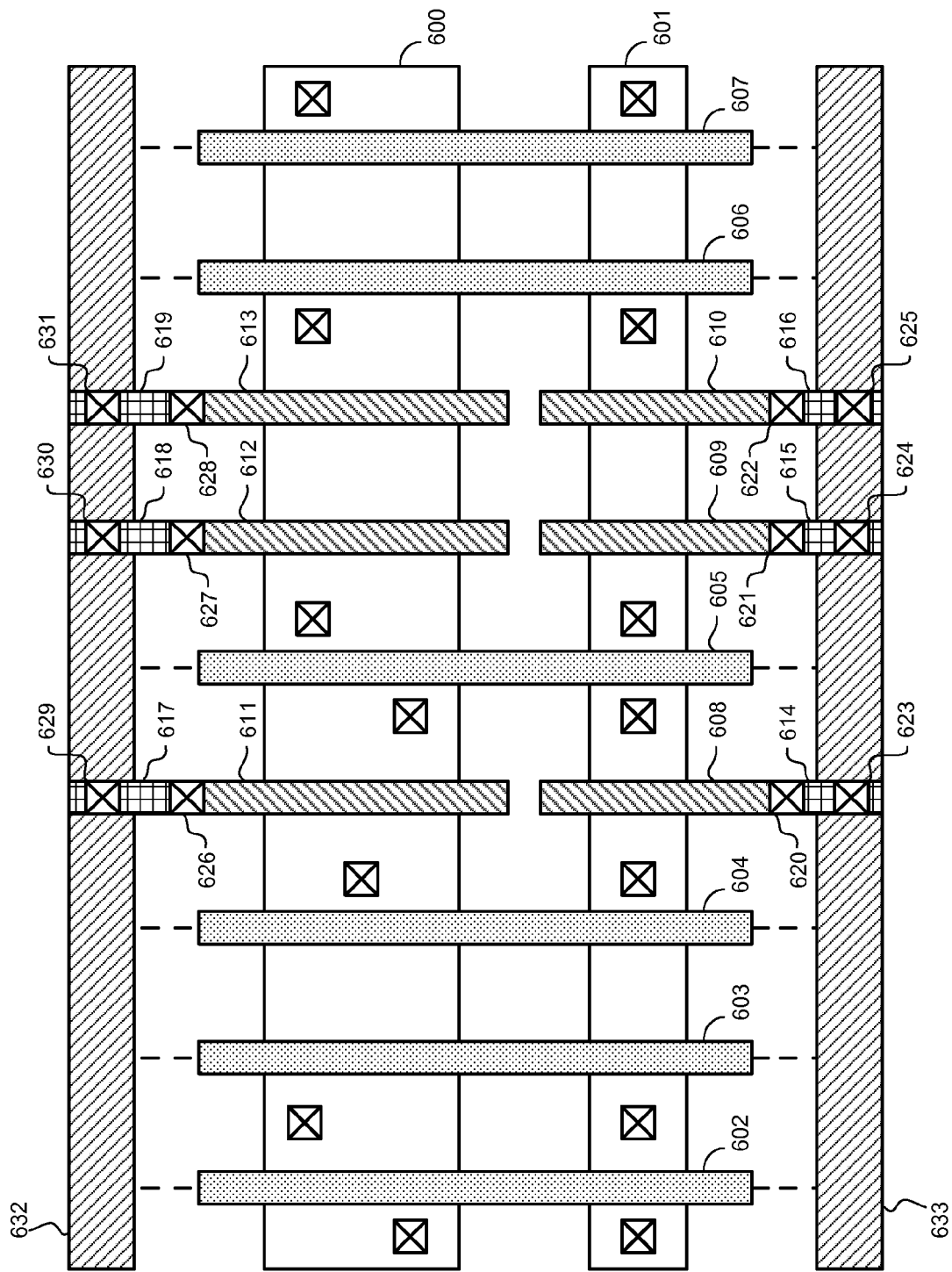
FIG. 6 illustrates another standard cell IC layout which includes continuous active diffusion regions in accordance with an embodiment of the present invention.

Note that in grid-based designs, such as those illustrated in FIGS. 4-6, the dummy polysilicon lines are already present, and merging disjoint active diffusion regions into continuous rows of active diffusion does not substantially increase the layout area used (e.g., the layout area in FIGS. 4-6 are substantially the same). All that is required is metal routing to couple the isolation gates to specified voltage sources.

FIG. 6 illustrates another standard cell IC layout which includes continuous active diffusion regions 600-601 in accordance with an embodiment of the present invention. Note that FIG. 6 illustrates the same set of IC devices as FIG. 5, but with different metal line configurations. Active diffusion regions 600-601 can be different types of active diffusion regions. For example, active diffusion region 600 can be a p-type diffusion region and active diffusion region 601 can be an n-type diffusion region. Polysilicon lines 602-607 and 611-613 overlap active diffusion region 600. Polysilicon lines 602-610 overlap active diffusion region 601.

In some embodiments, metal lines 632 and 633 are a power bus (e.g., VDD bus) and a ground bus (e.g., VSS bus), respectively. If active diffusion region 600 is p-type active diffusion, polysilicon lines 611-613 can be coupled to metal line 632 using contacts 626-631 and metal lines 617-619, respectively. In doing so, polysilicon lines 611-613 are coupled to VDD, thereby substantially turning off the transistors formed by polysilicon lines 611-613. If active diffusion region 601 is n-type active diffusion, polysilicon lines 608-610 can be coupled to metal line 633 using contacts 620-625 and metal lines 614-616, respectively. In doing so, polysilicon lines 608-610 are coupled to VSS, thereby substantially turning off the transistors formed by polysilicon lines 608-610.

Figure 7:
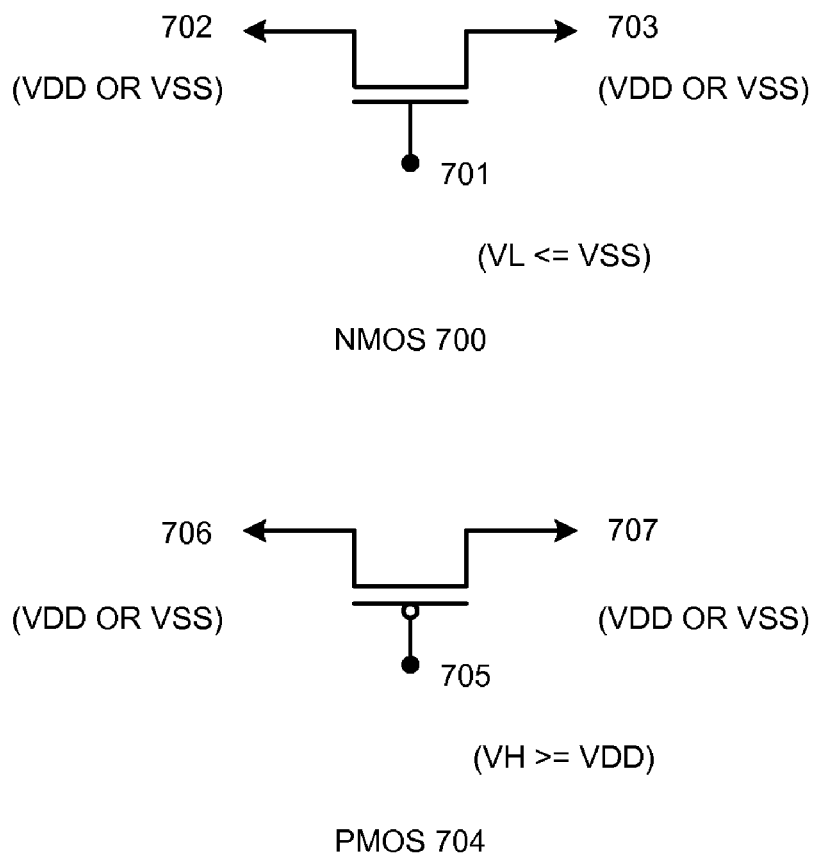
FIG. 7 illustrates biasing conditions for an NMOS and a PMOS transistor in accordance with an embodiment of the present invention.

FIG. 7 illustrates biasing conditions for a NMOS and PMOS isolation devices required to maintain electrical isolation between active IC devices and the isolation device in accordance with an embodiment of the present invention. For NMOS 700 to be configured as an isolation device, the voltage applied to gate 701 (VL) is selected to be substantially equal to or below the ground voltage (VSS). For PMOS 704 to be configured as an isolation device, the voltage applied to gate 705 (VH) is selected to be substantially equal to or higher than the supply voltage (VDD). In some embodiments, to minimize sub-threshold leakage currents, the voltage VL is selected to be lower than VSS for gate 701 and the voltage VH is selected to be higher than VDD for gate 705. Since gates 701 and 705 are set to a voltage which places the NMOS and PMOS transistors in cutoff (i.e., substantially no current flowing), the voltages on terminals 702-703 and 706-707 can be any voltage between VDD and VSS inclusive.

Figure 8:
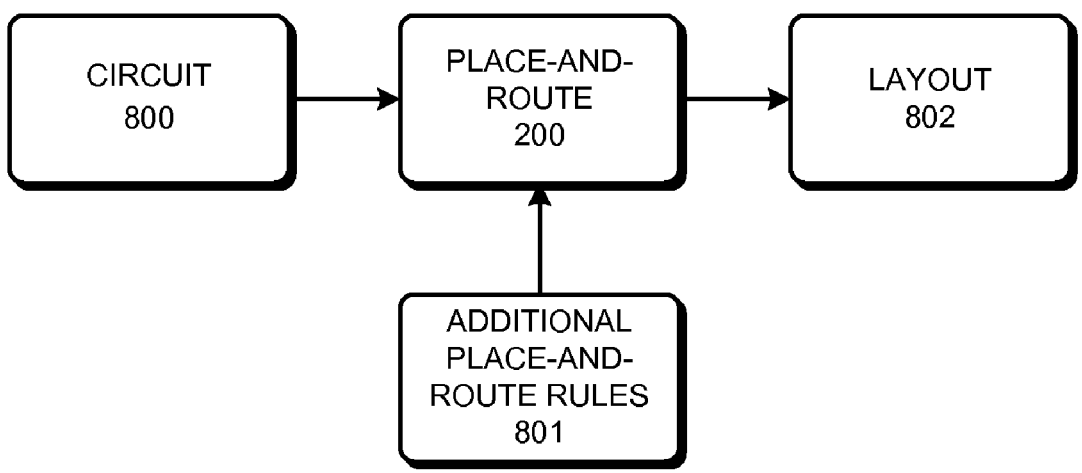
FIG. 8 presents a block diagram of the inputs and outputs of a place-and-route module in accordance with an embodiment of the present invention.

FIG. 8 presents a block diagram of the inputs and outputs of place-and-route module 200 in accordance with an embodiment of the present invention. Place-and-route module 200 receives circuit design 800 and additional place-and-route rules 801. Circuit design 800 can be generated by an IC design engineer (e.g., via schematic entry) or can be generated automatically from a hardware description language (HDL). Additional place-and-route rules 801 include, but are not limited to, rules which specify how to create continuous rows of active diffusion, how to populate the rows with IC devices and isolation devices, and how to route the metal layers so that the isolation devices are properly biased during operation. Place-and-route module 200 then generates layout 802 which includes continuous active diffusion regions and IC devices separated by isolation devices.

Figure 9:
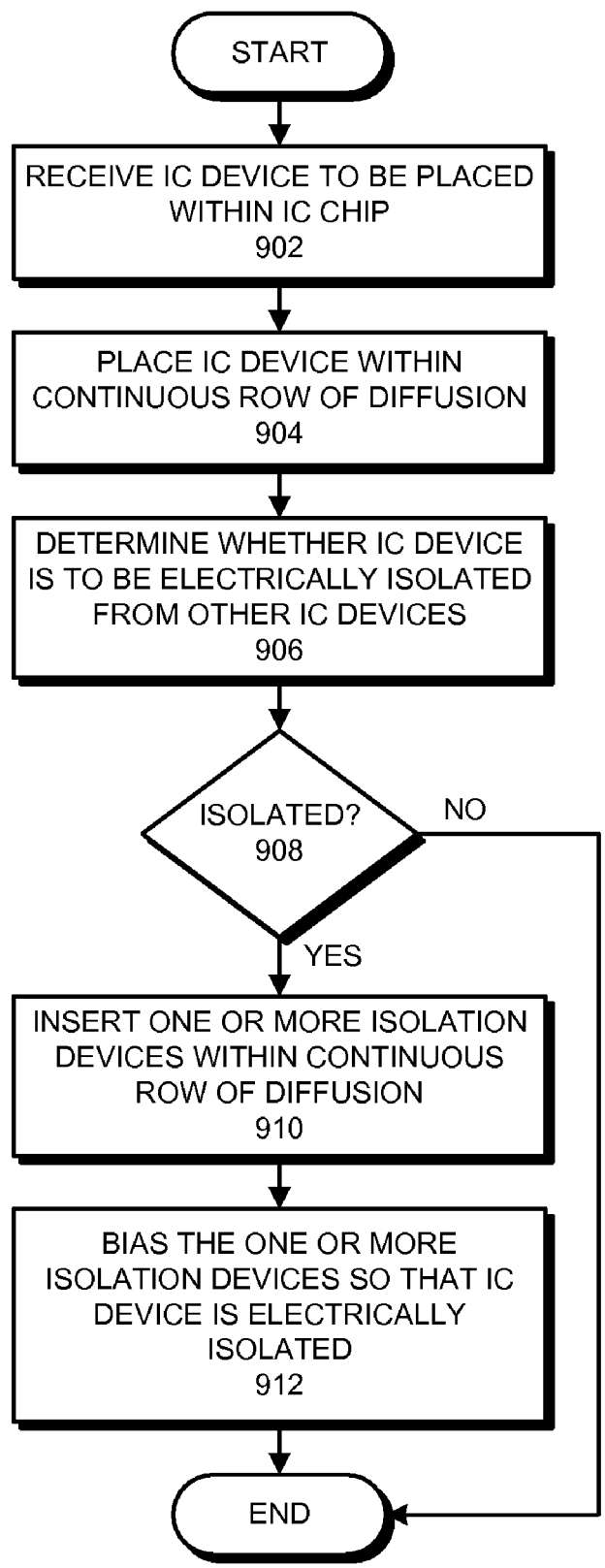
FIG. 9 presents a flow chart illustrating the process of placing an IC device within an IC chip layout in accordance with an embodiment of the present invention.

FIG. 9 presents a flow chart illustrating the process of placing an IC device within an IC chip layout in accordance with an embodiment of the present invention. The process begins when the system receives the IC device to be placed within the IC chip layout (step 902), wherein the IC chip layout includes one or more continuous rows of diffusion. Next, the system places the IC device within a continuous row of diffusion (step 904). The system then determines whether the IC device is to be electrically isolated from other IC devices (step 906). If so (step 908, yes), the system inserts one or more isolation devices within the continuous row of diffusion (step 910) so that the IC device can be electrically isolated from other IC devices. The system then biases the one or more isolation device so that the IC device is electrically isolated (step 912) from other IC devices within the continuous row of diffusion.

Hence, the present invention enables layout regularity to be achieved for both polysilicon and diffusion without compromising typical design methods and cell area. Furthermore, design and process variability is substantially minimized.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for placing an integrated circuit (IC) layout for reducing systematic variations that are expected to occur during manufacturing of the IC layout, comprising:
    using at least one computer for:
        creating one or more continuous rows of diffusion to reduce the systematic variations that are expected to occur during manufacturing of the IC layout;
        placing an IC device within a continuous row of diffusion in the one or more continuous rows of diffusion; and
        in response to determining that the IC device is to be electrically isolated from other IC devices,
            inserting, between the IC device and the other IC devices, a transistor which is formed by overlapping the continuous row of diffusion with a gate structure, and
            biasing the transistor by coupling the gate structure to a bias voltage which is either higher than a power supply voltage or lower than a ground voltage to minimize sub-threshold leakage currents.

2. The method of claim 1, wherein the IC device includes a transistor which is formed by overlapping the continuous row of diffusion with a gate structure.

3. The method of claim 1, wherein within a given continuous row of diffusion, gate structures for IC devices are substantially equally spaced.

4. The method of claim 1, wherein a given continuous row of diffusion substantially spans the entire IC chip layout.

5. The method of claim 4, wherein one or more isolation devices are placed at the ends of the given continuous row of diffusion.

6. The method of claim 1, wherein a given continuous row of diffusion has a predetermined width which is constant across the given continuous row of diffusion.

7. The method of claim 1, wherein prior to placing the IC device, the method further comprises generating the one or more continuous rows of diffusion within the IC chip layout.

8. The method of claim 1, wherein the continuous row of diffusion can include:
    n-type diffusion; and
    p-type diffusion.

9. A computer-readable storage medium storing instructions that when executed by a computer cause the computer to perform a method for placing an integrated circuit (IC) layout for reducing systematic variations that are expected to occur during manufacturing of the IC layout, wherein the method comprises:
    creating one or more continuous rows of diffusion to reduce the systematic variations that are expected to occur during manufacturing of the IC layout;
    placing an IC device within a continuous row of diffusion in the one or more continuous rows of diffusion; and
    in response to determining that the IC device is to be electrically isolated from other IC devices, inserting, between the IC device and the other IC devices, a transistor which is formed by overlapping the continuous row of diffusion with a gate structure, and biasing the transistor by coupling the gate structure to a bias voltage which is either higher than a power supply voltage or lower than a ground voltage to minimize sub-threshold leakage currents.

10. The computer-readable storage medium of claim 9, wherein the IC device includes a transistor which is formed by overlapping the continuous row of diffusion with a gate structure.

11. The computer-readable storage medium of claim 9, wherein within a given continuous row of diffusion, gate structures for IC devices are substantially equally spaced.

12. The computer-readable storage medium of claim 9, wherein a given continuous row of diffusion substantially spans the entire IC chip layout.

13. The computer-readable storage medium of claim 12, wherein one or more isolation devices are placed at the ends of the given continuous row of diffusion.

14. The computer-readable storage medium of claim 9, wherein a given continuous row of diffusion has a predetermined width which is constant across the given continuous row of diffusion.

15. The computer-readable storage medium of claim 9, wherein prior to placing the IC device, the method further comprises generating the one or more continuous rows of diffusion within the IC chip layout.

16. The computer-readable storage medium of claim 9, wherein the continuous row of diffusion can include:
   n-type diffusion; and
   p-type diffusion.

17. An apparatus for placing an integrated circuit (IC) layout for reducing systematic variations that are expected to occur during manufacturing of the IC layout, comprising:
   a placement mechanism configured to:
      create one or more continuous rows of diffusion to reduce the systematic variations that are expected to occur during manufacturing of the IC layout;
      place an IC device within a continuous row of diffusion in the one or more continuous rows of diffusion; and
      in response to determining that the IC device is to be electrically isolated from other IC devices,
         insert, between the IC device and the other IC devices, a transistor which is formed by overlapping the continuous row of diffusion with a gate structure, and
         bias the transistor by coupling the gate structure to a bias voltage which is either higher than a power supply voltage or lower than a ground voltage to minimize sub-threshold leakage currents.

* * * * *